United States Patent
Matsushita

(10) Patent No.: US 9,496,332 B1
(45) Date of Patent: Nov. 15, 2016

(54) SEMICONDUCTOR DEVICE

(71) Applicant: Kabushiki Kaisha Toshiba, Minato-ku, Tokyo (JP)

(72) Inventor: Kenichi Matsushita, Nonoichi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/015,271

(22) Filed: Feb. 4, 2016

(30) Foreign Application Priority Data

Sep. 2, 2015 (JP) ................. 2015-173184

(51) Int. Cl.
*H01L 29/66* (2006.01)
*H01L 21/00* (2006.01)
*H01L 29/06* (2006.01)
*H01L 29/872* (2006.01)

(52) U.S. Cl.
CPC ....... *H01L 29/0626* (2013.01); *H01L 29/0623* (2013.01); *H01L 29/872* (2013.01)

(58) Field of Classification Search
CPC .................................. H01L 29/0626
USPC .................... 438/91, 489; 257/199
See application file for complete search history.

(56) References Cited

FOREIGN PATENT DOCUMENTS

| JP | 2003-298072 A | | 10/2003 | |
|----|---------------|---|---------|---|
| JP | 2007-311822 A | | 11/2007 | |
| JP | 2012-114104 | * | 2/2009 | ............ H01L 29/78 |
| JP | 2013/254858 | * | 6/2012 | ............ H01L 29/47 |
| JP | 2013-254858 A | | 12/2013 | |

\* cited by examiner

*Primary Examiner* — Calvin Lee
(74) *Attorney, Agent, or Firm* — White & Case LLP

(57) ABSTRACT

According to one embodiment, a semiconductor device comprises a first semiconductor region of a first conductivity type, a second semiconductor region of a second conductivity type, a third semiconductor region of the second conductivity type, a fourth semiconductor region of the second conductivity type, and an insulating unit. The fourth semiconductor region is separated from the third semiconductor region. A carrier concentration of the second conductivity type of the fourth semiconductor region is higher than a carrier concentration of the second conductivity type of the second semiconductor region. The fourth semiconductor region protrudes below more than the third semiconductor region. The insulating unit is provided on a portion of the second semiconductor region positioned between the third semiconductor region and the fourth semiconductor region and on the fourth semiconductor region.

13 Claims, 11 Drawing Sheets

SEMICONDUCTOR DEVICE

CROSS-REFERENCE TO RELATED APPLICATIONS

This application is based upon and claims the benefit of priority from Japanese Patent Application No. 2015-173184, filed on Sep. 2, 2015; the entire contents of which are incorporated herein by reference.

FIELD

Embodiments described herein relate generally to a semiconductor device.

BACKGROUND

Semiconductor devices such as diodes and the like are used widely in power conversion circuits, etc. When switching a power supply from the ON state to the OFF state in a power conversion circuit, a surge voltage is applied to the diode due to the parasitic inductance component inside the circuit connected to the diode. At this time, there are cases where the electric field inside the diode exceeds the critical electric field due to the surge voltage; impact ionization occurs; and avalanche breakdown occurs.

DETAILED DESCRIPTION

Figure 1:
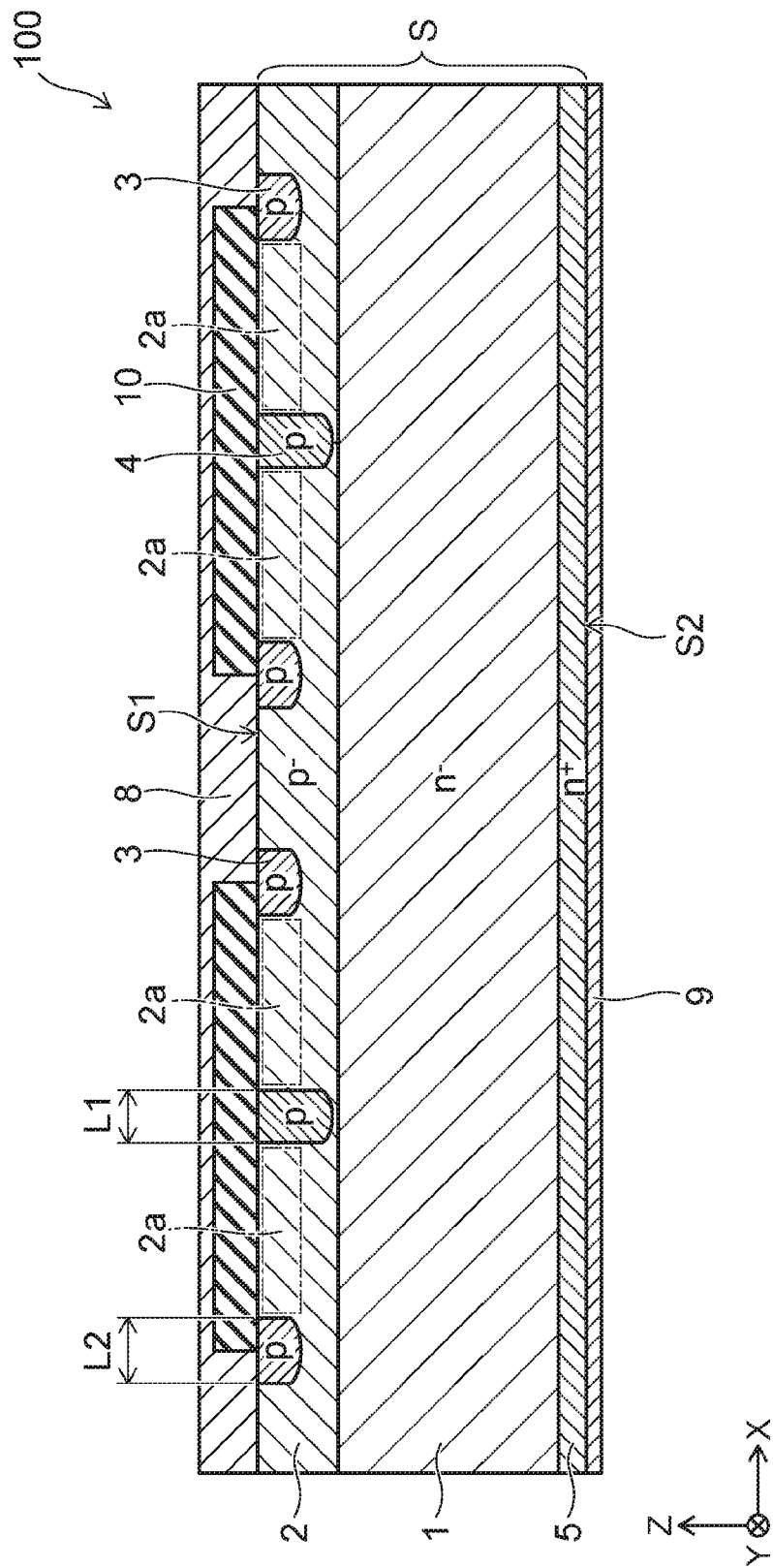
FIG. 1 is a cross-sectional view of the semiconductor device according to the first embodiment.

According to one embodiment, a semiconductor device comprises a first semiconductor region of a first conductivity type, a second semiconductor region of a second conductivity type, a third semiconductor region of the second conductivity type, a fourth semiconductor region of the second conductivity type, and an insulating unit. The second semiconductor region is provided on the first semiconductor region. At least a portion of the third semiconductor region is surrounded with the second semiconductor region. At least a portion of the fourth semiconductor region is surrounded with the second semiconductor region. The fourth semiconductor region is separated from the third semiconductor region. A carrier concentration of the second conductivity type of the fourth semiconductor region is higher than a carrier concentration of the second conductivity type of the second semiconductor region. The fourth semiconductor region protrudes below more than the third semiconductor region. The insulating unit is provided on a portion of the second semiconductor region positioned between the third semiconductor region and the fourth semiconductor region and on the fourth semiconductor region.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the following description, the notations of $n^+$, $n$, $n^-$, $p^+$, $p$, and $p^+$ indicate relative levels of the impurity concentrations of the conductivity types. Namely, $n^+$ indicates that the n-type impurity concentration is relatively higher than that of n; and $n^-$ indicates that the n-type impurity concentration is relatively lower than that of n. $p^+$ indicates that the p-type impurity concentration is relatively higher than that of p; and $p^-$ indicates that the p-type impurity concentration is relatively lower than that of p.

In the drawings and the specification of the application, components similar to those described thereinabove are marked with like reference numerals, and a detailed description is omitted as appropriate.

The embodiments described below may be implemented by reversing the p-type and the n-type of the semiconductor regions.

First Embodiment

A semiconductor device 100 according to a first embodiment will now be described using FIG. 1 to FIG. 3.

FIG. 1 is a cross-sectional view of the semiconductor device 100 according to the first embodiment.

Figure 2:
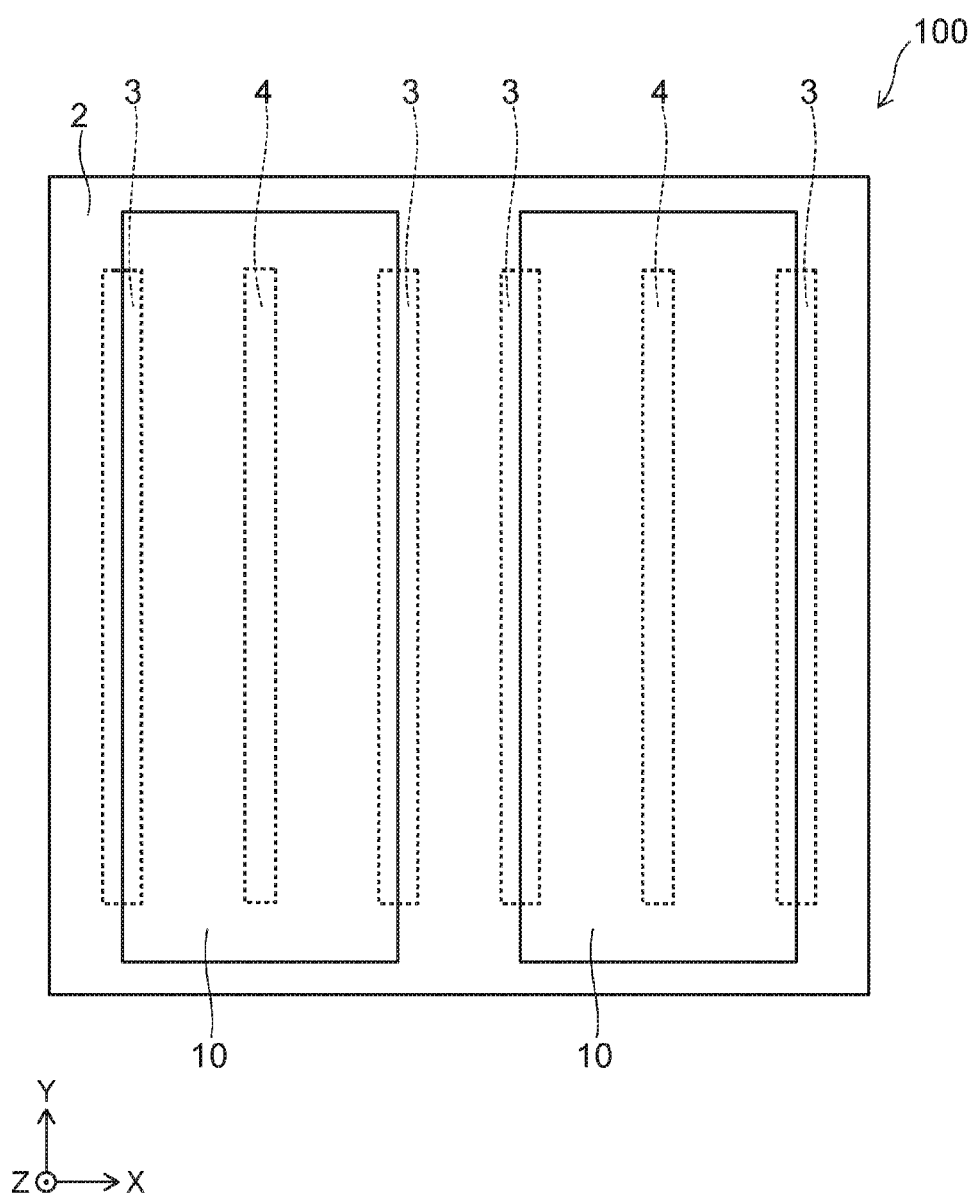
FIG. 2 is an example of a plan view of the semiconductor device according to the first embodiment.

FIG. 2 is an example of a plan view of the semiconductor device 100 according to the first embodiment.

Figure 3:
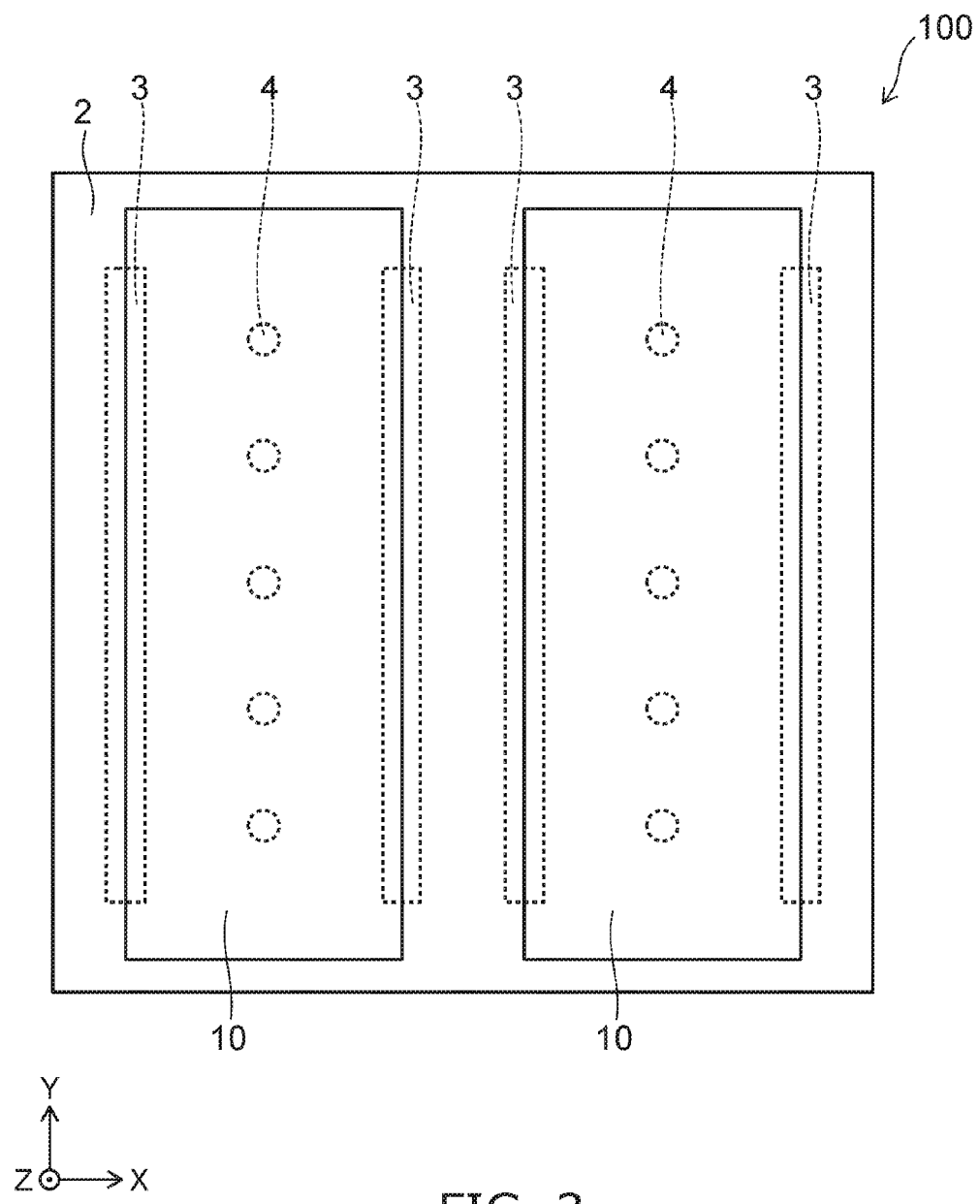
FIG. 3 is another example of a plan view of the semiconductor device according to the first embodiment.

FIG. 3 is another example of a plan view of the semiconductor device 100 according to the first embodiment.

The semiconductor device 100 is, for example, a diode.

The semiconductor device 100 includes a semiconductor layer S, an anode electrode 8 (a first electrode), and a cathode electrode 9 (a second electrode).

The semiconductor layer S includes a semiconductor region 1 (a first semiconductor region) of an $n^-$-type (a first conductivity type), an $n^+$-type semiconductor region 5 (a sixth semiconductor region), a semiconductor region 2 (a second semiconductor region) of a $p^-$-type (a second conductivity type), a p-type semiconductor region 3 (a third semiconductor region), and a p-type semiconductor region 4 (a fourth semiconductor region). The $n^-$-type semiconductor region 1 and the $n^+$-type semiconductor region 5 are included in the cathode of the diode. The $p^-$-type semiconductor region 2, the p-type semiconductor region 3, and the p-type semiconductor region 4 are included in the anode of the diode.

As shown in FIG. 1, the semiconductor layer S has a front surface S1 and a back surface S2. The anode electrode 8 is provided at the front surface S1. The cathode electrode 9 is provided at the back surface S2.

The n$^+$-type semiconductor region 5 is formed inside the semiconductor layer S on the back surface S2 side. The n$^+$-type semiconductor region 5 is electrically connected to the cathode electrode 9.

The n$^-$-type semiconductor region 1 is provided on the n$^+$-type semiconductor region 5. The n$^-$-type semiconductor region 1 is provided uniformly on the n$^+$-type semiconductor region 5.

The p$^-$-type semiconductor region 2 is provided on the n$^-$-type semiconductor region 1 and is positioned inside the semiconductor layer S on the front surface S1 side.

The p-type semiconductor region 3 is multiply provided in the X-direction. In the example shown in FIG. 1, the p-type semiconductor region 3 is surrounded with the p$^-$-type semiconductor region 2. Or, a portion of the p-type semiconductor region 3 may be surrounded with the p$^-$-type semiconductor region 2; and another portion of the p-type semiconductor region 3 may be surrounded with the n$^-$-type semiconductor region 1.

The p-type semiconductor region 4 is multiply provided in the X-direction. The p-type semiconductor region 4 is provided to be separated from the p-type semiconductor region 3 and is surrounded with the p$^-$-type semiconductor region 2. Or, a portion of the p-type semiconductor region 4 may be surrounded with the p$^-$-type semiconductor region 2; and another portion of the p-type semiconductor region 4 may be surrounded with the n$^-$-type semiconductor region 1. A portion (a portion 2a) of the p$^-$-type semiconductor region 2 is provided between the p-type semiconductor region 3 and the p-type semiconductor region 4.

The depth of the p-type semiconductor region 4 is deeper than the depth of the p-type semiconductor region 3. The p-type semiconductor region 4 protrudes below more than the p-type semiconductor region 3. In other words, the p-type semiconductor region 4 includes a first end portion in a first direction (a –Z direction) from the p$^-$-type semiconductor region 2 toward the n$^-$-type semiconductor region 1; and the p-type semiconductor region 3 includes a second end portion in the –Z direction. The first end portion is provided on the –Z direction side of the second end portion. The first end portion being positioned on the –Z direction side of the second end portion means that the first end portion is provided in the –Z direction as viewed from a plane orthogonal to the –Z direction and including the second end portion.

In other words, the distance in the Z-direction between the n$^+$-type semiconductor region 5 and the p-type semiconductor region 4 is shorter than the distance in the Z-direction between the n$^+$-type semiconductor region 5 and the p-type semiconductor region 3.

The p-type impurity concentration of the p-type semiconductor region 4 may be equal to or higher than the p-type impurity concentration of the p-type semiconductor region 3.

A length L1 in the X-direction of the p-type semiconductor region 4 is shorter than a length L2 in the X-direction of the p-type semiconductor region 3. However, as long as the depth of the p-type semiconductor region 4 is deeper than the depth of the p-type semiconductor region 3, the length L1 may be equal to or longer than the length L2.

For example, the p-type semiconductor region 4 is provided between two p-type semiconductor regions 3 adjacent to each other in the X-direction as shown in FIG. 1. However, one p-type semiconductor region 4 may be provided for three or more p-type semiconductor regions 3. Or, one p-type semiconductor region 4 may be provided for one p-type semiconductor region 3.

An insulating unit 10 is provided on the p-type semiconductor region 4 and on at least a portion of the portion 2a. The insulating unit 10 may be further provided on at least one of the two p-type semiconductor regions 3 adjacent to the p-type semiconductor region 4. In the example shown in FIG. 1, the insulating unit 10 is provided on the p-type semiconductor region 4, the p-type semiconductor regions 3, and the portion 2a and contacts these regions.

The anode electrode 8 is provided on the insulating unit 10.

A portion of the p$^-$-type semiconductor region 2 contacts the anode electrode 8 and has a Schottky junction with the anode electrode 8. At least one of the multiple p-type semiconductor regions 3 contacts the anode electrode 8 and has an ohmic junction with the anode electrode 8.

For example, the p-type semiconductor region 3, the p-type semiconductor region 4, and the insulating unit 10 extend in the Y-direction as shown in FIG. 2. The length in the Y-direction of the p-type semiconductor region 3 may be equal to or different from the length in the Y-direction of the p-type semiconductor region 4.

Or, as shown in FIG. 3, the p-type semiconductor region 4 may be multiply provided in the Y-direction. In such a case, the lengths in the Y-direction of the p-type semiconductor regions 4 are shorter than the length in the Y-direction of the p-type semiconductor region 3. Although the multiple p-type semiconductor regions 4 are arranged in the Y-direction in the example shown in FIG. 3, the position in the X-direction may be different between the p-type semiconductor regions 4.

A method for manufacturing the semiconductor device 100 according to the first embodiment will now be described using FIGS. 4A to 4D.

FIGS. 4A to 4D are cross-sectional views of processes, showing the manufacturing processes of the semiconductor device 100 according to the first embodiment.

Figure 4A:
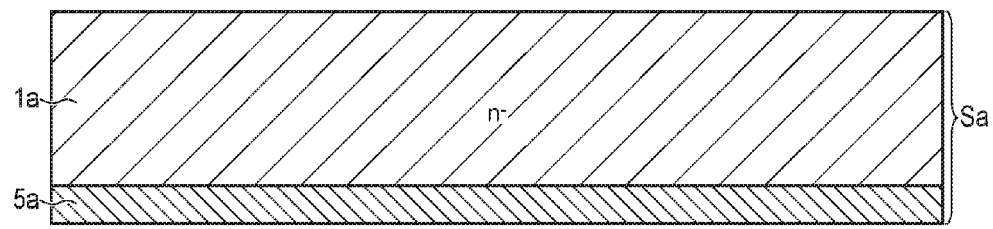
FIGS. 4A to 4D are cross-sectional views of processes, showing the manufacturing processes of the semiconductor device according to the first embodiment.

First, as shown in FIG. 4A, a semiconductor layer Sa that includes an n$^+$-type semiconductor region 5a and an n$^-$-type semiconductor region 1a is prepared. For example, Si is a major component of the semiconductor layer Sa. For example, the semiconductor layer Sa is formed on an n$^+$-type semiconductor substrate by epitaxial growth of a Si layer while adding an n-type impurity. For example, phosphorus or arsenic is used as the n-type impurity.

Then, a p-type impurity is ion-implanted into the front surface of the semiconductor layer Sa to form the p$^-$-type semiconductor region 2. Continuing, a p-type impurity is ion-implanted into the semiconductor layer Sa to form the p-type semiconductor region 3 and the p-type semiconductor region 4. For example, more of the p-type impurity is ion-implanted into the region where the p-type semiconductor region 4 is formed than in the region where the p-type semiconductor region 3 is formed. For example, boron is used as the p-type impurity.

Figure 4B:
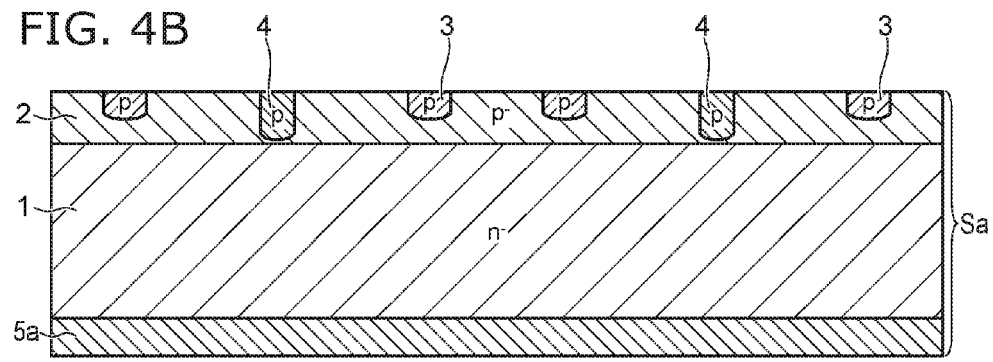

The p$^-$-type semiconductor region 2, the p-type semiconductor region 3, and the p-type semiconductor region 4 are formed as shown in FIG. 4B by heating the semiconductor layer Sa after performing the ion implantation of the p-type impurity to form each region. The heating of the semiconductor layer Sa may be performed each time the ion implantation is performed to form each semiconductor region.

Then, the insulating unit 10 is formed on the semiconductor layer Sa. For example, the insulating unit 10 is formed by forming an insulating layer using CVD (Chemical Vapor Deposition) and by patterning the insulating layer using photolithography and dry etching. The insulating unit 10 includes, for example, silicon oxide.

Figure 4C:
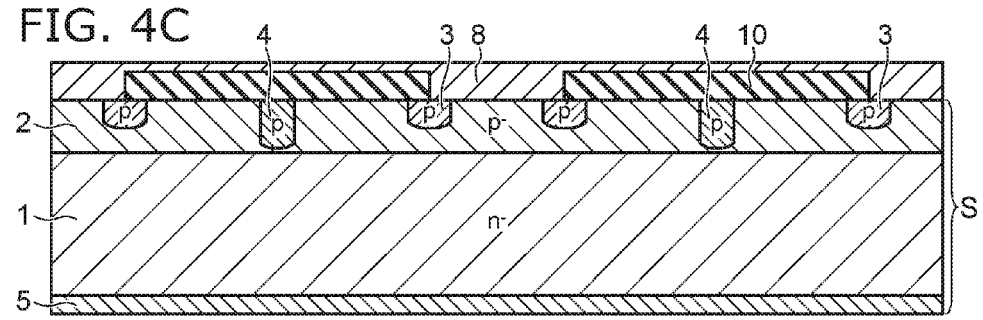

Then, the anode electrode 8 is formed on the semiconductor layer Sa by forming a metal layer. Continuing as shown in FIG. 4C, the back surface of the semiconductor layer Sa is polished; and the semiconductor layer S is formed. At this time, the semiconductor layer Sa is polished so that the end point of the polishing is inside the n$^+$-type semiconductor region 5a. By this process, the n$^+$-type semiconductor region 5 shown in FIG. 1 is formed.

Figure 4D:
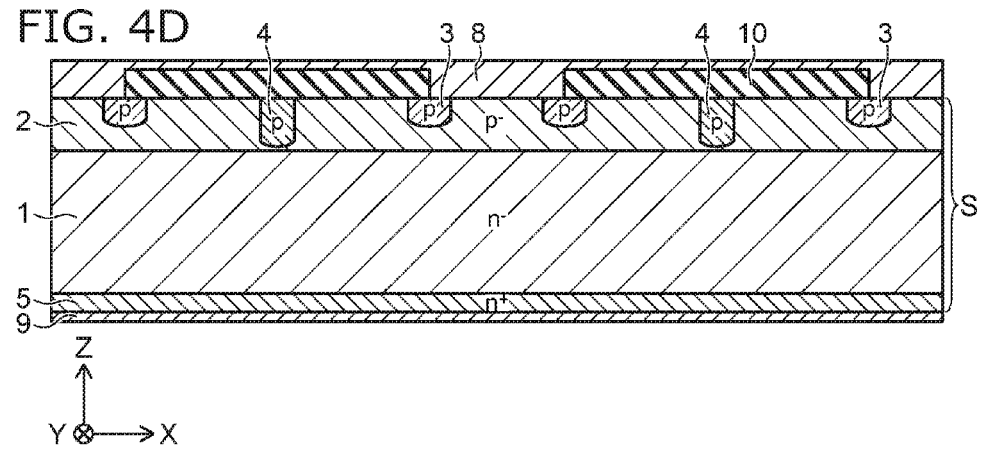

Then, as shown in FIG. 4D, the cathode electrode 9 is formed on the back surface of the semiconductor layer S by forming a metal layer.

The semiconductor device 100 shown in FIG. 1 is obtained by the processes described above.

Operations and effects according to the embodiment will now be described.

According to the embodiment, the likelihood of breakdown of the semiconductor device occurring due to avalanche breakdown due to impact ionization can be reduced.

This is due to the following reasons.

When a surge voltage is applied to the semiconductor device, there are cases where impact ionization occurs at the vicinity of the junction between the p-type semiconductor of the anode and the n-type semiconductor of the cathode. When carriers are generated due to the impact ionization and avalanche breakdown occurs, there is a possibility that breakdown of the semiconductor device may occur.

Conversely, the semiconductor device 100 according to the embodiment includes the p-type semiconductor region 3, the p-type semiconductor region 4, and the insulating unit 10. The end portion in the −Z direction of the p-type semiconductor region 4 is positioned on the −Z direction side of the end portion in the −Z direction of the p-type semiconductor region 3. Therefore, when the surge voltage is applied to the semiconductor device 100, the likelihood of impact ionization occurring in the p-type semiconductor region 4 is higher than the likelihood of impact ionization occurring in the p-type semiconductor region 3.

When impact ionization occurs in the p-type semiconductor region 4 and avalanche breakdown occurs, a current flows between the p-type semiconductor region 4 and the anode electrode 8. Because the insulating unit 10 is provided directly above the p-type semiconductor region 4, the current flows in the anode electrode 8 via the p$^-$-type semiconductor region 2. On the other hand, the p-type impurity concentration of the p$^-$-type semiconductor region 2 is lower than the p-type impurity concentration of the p-type semiconductor region 4. In other words, the electrical resistance of the p$^-$-type semiconductor region 2 is higher than the electrical resistance of the p-type semiconductor region 4.

A voltage drop occurs due to the current flowing through the p$^-$-type semiconductor region 2; and the potential of the p-type semiconductor region 4 becomes lower than the potential of the anode electrode 8. The voltage drop increases as the current flowing in the p-type semiconductor region 4 increases because the current flowing through the p$^-$-type semiconductor region 2 also increases. Accordingly, the potential of the p-type semiconductor region 4 decreases as the current flowing in the p-type semiconductor region 4 increases.

The likelihood of impact ionization occurring in the p-type semiconductor region 4 decreases as the potential of the p-type semiconductor region 4 decreases. Therefore, the likelihood of avalanche breakdown occurring in the p-type semiconductor region 4 also decreases; and the current flowing through the p-type semiconductor region 4 becomes small. As a result, compared to the case where the impact ionization occurs in the p-type semiconductor region 3, the likelihood of a current large enough to cause breakdown of the semiconductor device flowing through the semiconductor device 100 can be reduced. Accordingly, the breakdown energy of the semiconductor device can be improved.

The p$^-$-type semiconductor region 2 and the anode electrode 8 have a Schottky junction. When the temperature of the Schottky junction increases, the leakage current when a reverse voltage is applied greatly increases. By providing the insulating unit 10 on the p-type semiconductor region 4, the p-type semiconductor region 3, and the portion 2a, the increase of the leakage current can be prevented even in the case where the Schottky junction is set to be long. As a result, the path of the current in the p$^-$-type semiconductor region 2 can be set to be long. By setting the path of the current in the p$^-$-type semiconductor region 2 to be long, the voltage drop in the p$^-$-type semiconductor region 2 when the current flows through the p$^-$-type semiconductor region 2 is larger; and it is possible to set the potential of the p-type semiconductor region 4 to be lower. Accordingly, the likelihood of breakdown of the semiconductor device occurring can be reduced even further.

According to the embodiment as described above, it is possible to reduce the current flowing in the p-type semiconductor region 4. By reducing the current flowing in the p-type semiconductor region 4, the heat amount that is generated in the p-type semiconductor region 4 also decreases. Therefore, the increase of the temperature of the Schottky junction between the p$^-$-type semiconductor region 2 and the anode electrode 8 is suppressed; and it is possible to reduce the likelihood of breakdown of the semiconductor device occurring due to the increase of the leakage current.

In the case where the p-type semiconductor regions 4 are multiply provided, impact ionization occurs and a current flows in a portion of the multiple p-type semiconductor regions 4. Then, when the potential of the portion of the p-type semiconductor region 4 decreases, impact ionization occurs in another portion of the p-type semiconductor region 4. Therefore, the likelihood of impact ionization occurring in the p-type semiconductor region 3 is reduced further; and it is possible to reduce even further the likelihood of breakdown of the semiconductor device.

Also, in the case where the p-type semiconductor region 4 extends in the Y-direction, the impact ionization may occur in multiple locations in the Y-direction. Therefore, compared to the case where the impact ionization occurs concentratively in one location, it is possible to reduce the current density when the current flows in the p-type semiconductor region 4. Also, by the impact ionization occurring in multiple locations in the Y-direction, the heat is generated dispersedly; and it is possible to suppress the temperature increase of the semiconductor device.

Or, in the case where the p-type semiconductor regions 4 are multiply provided in the Y-direction, the impact ionization occurs in each of the p-type semiconductor regions 4; and the current flows in the portions where the p-type semiconductor regions 4 are provided. For example, the case is considered where the p-type semiconductor region 4 is provided to extend in a designated direction, and impact ionization occurs at multiple locations inside the p-type semiconductor region 4. In such a case, there is a possibility that carriers generated at multiple locations may concentrate at some one point inside the p-type semiconductor region 4; and a large current may flow locally. By multiply providing the p-type semiconductor regions 4 in the Y-direction, the local flow of the large current due to the concentration of the carriers generated at the multiple locations is suppressed.

Impact ionization occurs in the tip of a semiconductor region having a large curvature. This is because, in the case where the curvature of the tip is large, concentration of the electric field occurs at the tip vicinity. Accordingly, it is effective to set the length in the X-direction of the p-type semiconductor region 4 to be shorter than the length in the X-direction of the p-type semiconductor region 3. This is because the curvature of the tip of the semiconductor region is increased by forming the semiconductor region so that the length in the X-direction is short. By setting the length in the X-direction of the p-type semiconductor region 4 to be shorter than the length in the X-direction of the p-type semiconductor region 3, the likelihood of impact ionization occurring in the p-type semiconductor region 4 can be increased while reducing the likelihood of impact ionization occurring in the p-type semiconductor region 3. As a result, it is possible to improve the breakdown energy of the semiconductor device even more.

Second Embodiment

A semiconductor device 200 according to a second embodiment will now be described using FIG. 5.

Figure 5:
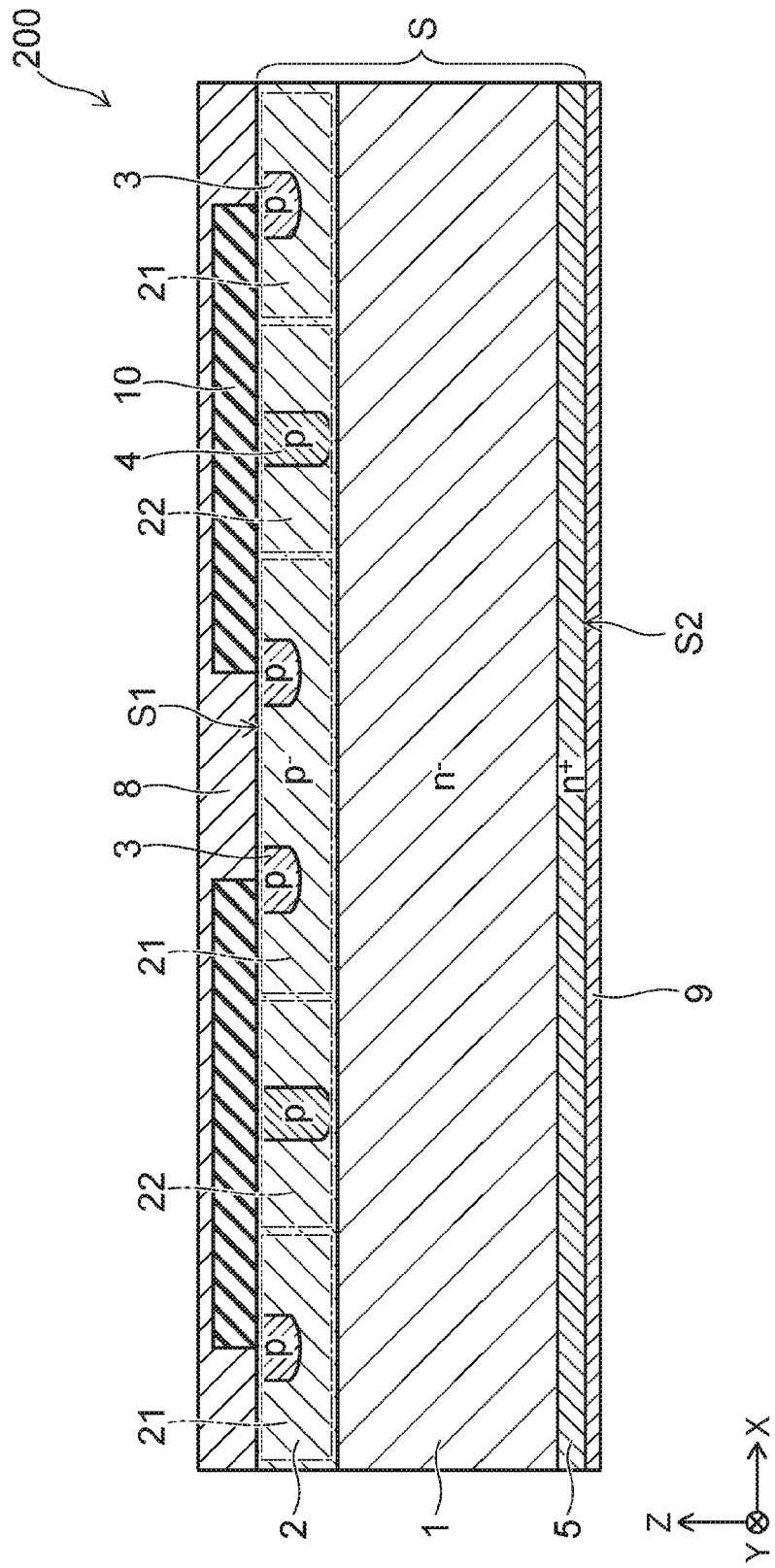
FIG. 5 is a cross-sectional view of the semiconductor device according to the second embodiment.

FIG. 5 is a cross-sectional view of the semiconductor device 200 according to the second embodiment.

For example, the $p^-$-type semiconductor region 2 of the semiconductor device 200 is different from that of the semiconductor device 100. For example, other than the $p^-$-type semiconductor region 2, a structure similar to that of the semiconductor device 100 is employable as the structure of the semiconductor device 200.

The $p^-$-type semiconductor region 2 includes a first portion 21 and a second portion 22. The p-type impurity concentration of the second portion 22 is lower than the p-type impurity concentration of the first portion 21. For example, the first portion 21 and the second portion 22 are provided alternately in the X-direction. For example, the length in the X-direction of the first portion 21 is longer than the length in the X-direction of the second portion 22.

At least a portion of the p-type semiconductor region 3 is surrounded with the first portion 21. At least a portion of the p-type semiconductor region 4 is surrounded with the second portion 22.

Because the p-type impurity concentration of the second portion 22 is lower than the p-type impurity concentration of the first portion 21, the electrical resistance of the second portion 22 is higher than the electrical resistance of the first portion 21. When the current flows between the p-type semiconductor region 4 and the anode electrode 8, the current passes through the second portion 22. Accordingly, because the $p^-$-type semiconductor region 2 includes the second portion 22, it is possible to set the voltage drop when the current flows through the $p^-$-type semiconductor region 2 to be larger than that of the first embodiment. The potential of the p-type semiconductor region 4 can be reduced even further by increasing the voltage drop. As a result, compared to the first embodiment, it is possible to further reduce the likelihood of breakdown of the semiconductor device.

Third Embodiment

A semiconductor device 300 according to a third embodiment will now be described using FIG. 6.

Figure 6:
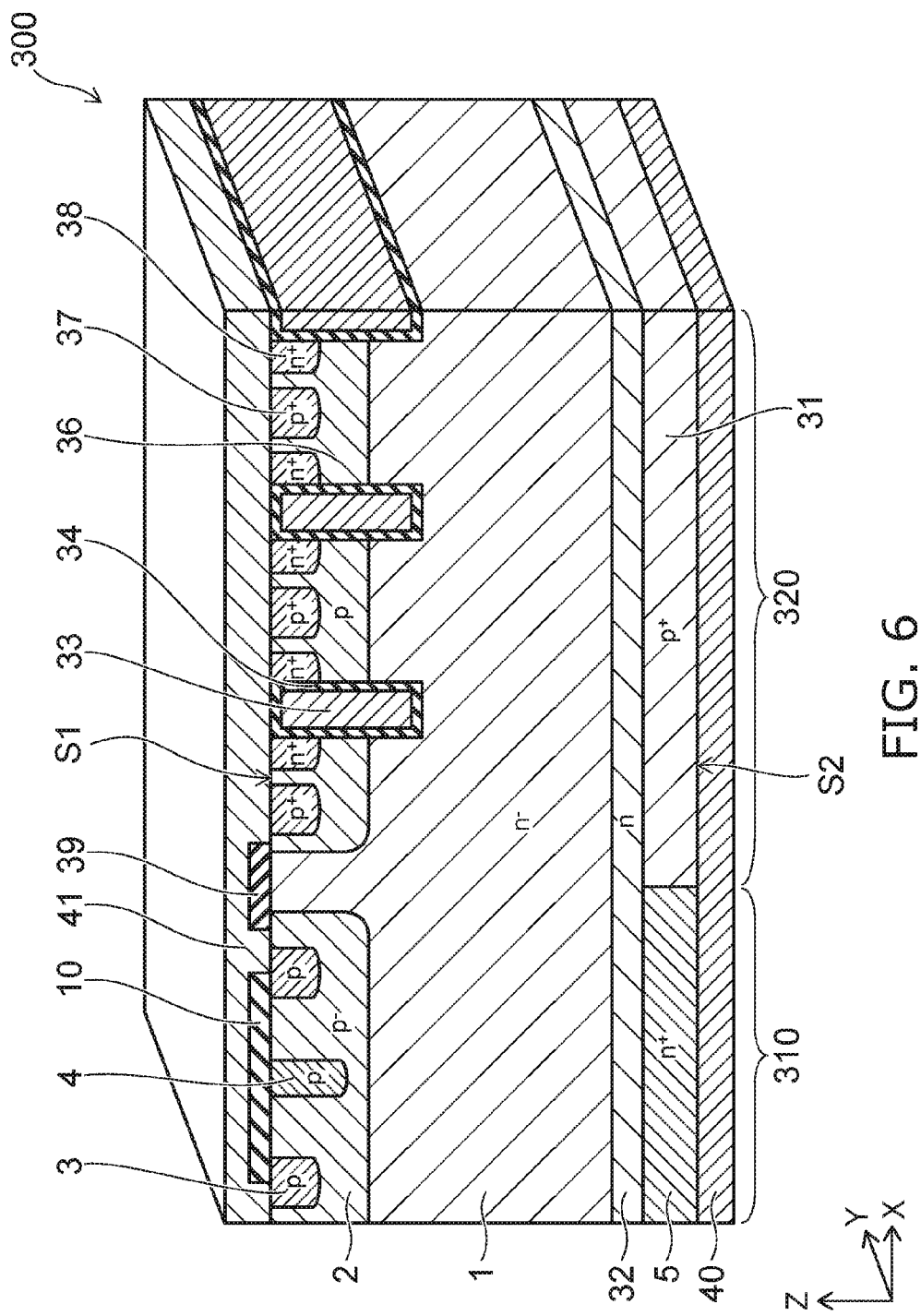
FIG. 6 is a cross-sectional view of the semiconductor device according to the third embodiment.

FIG. 6 is a cross-sectional view of the semiconductor device 300 according to the third embodiment.

The semiconductor device 300 is, for example, an RC-IGBT that includes a FRD (Fast Recovery Diode) region 310 and an IGBT (Insulated Gate Bipolar Transistor) region 320.

The semiconductor device 300 includes a semiconductor layer, a collector electrode 40 (the first electrode), and an emitter electrode 41 (the second electrode).

The semiconductor layer includes the semiconductor region 1 (the first semiconductor region) of the $n^-$-type (the first conductivity type), the semiconductor region 2 (the second semiconductor region) of the $p^-$-type (the second conductivity type), the p-type semiconductor region 3 (the third semiconductor region), the p-type semiconductor region 4 (the fourth semiconductor region), the $n^+$-type semiconductor region 5, a $p^+$-type collector region 31, an n-type buffer region 32, a p-type base region 36, a $p^+$-type contact region 37, an $n^+$-type emitter region 38, a gate electrode 33, a gate insulating layer 34, and an insulating unit 39.

The FRD region 310 includes the $n^+$-type semiconductor region 5, a portion of the n-type buffer region 32, a portion of the $n^-$-type semiconductor region 1, the $p^-$-type semiconductor region 2, the p-type semiconductor region 3, the p-type semiconductor region 4, and the insulating unit 10. For example, the $p^-$-type semiconductor region 2, the p-type semiconductor region 3, the p-type semiconductor region 4, and the insulating unit 10 of the FRD region 310 have structures similar to those of the semiconductor device 100 according to the first embodiment.

The IGBT region 320 includes the $p^+$-type collector region 31, a portion of the n-type buffer region 32, a portion of the $n^-$-type semiconductor region 1, the gate electrode 33, the gate insulating layer 34, the p-type base region 36, the $p^+$-type contact region 37, and the $n^+$-type emitter region 38.

The $p^+$-type collector region 31 is provided on the back surface S2 side inside the semiconductor layer S and is electrically connected to the collector electrode 40. The n-type buffer region 32 is provided on the $p^+$-type collector region 31 and on the $n^+$-type semiconductor region 5.

The p-type base region 36 is provided on the $n^-$-type semiconductor region 1 and is positioned on the front surface S1 side inside the semiconductor layer S. For example, the p-type base region 36 is separated from the $p^-$-type semiconductor region 2 in the X-direction. To electrically isolate the p-type base region 36 and the $p^-$-type semiconductor region 2, the insulating unit 39 is formed to cover the end portion of the p-type base region 36, the end portion of the $p^-$-type semiconductor region 2, and the $n^-$-type semiconductor region 1 between the end portion of the p-type base region 36 and the end portion of the $p^-$-type semiconductor region 2.

The $n^+$-type emitter region 38 is selectively provided on the p-type base region 36 and is electrically connected to the emitter electrode 41. Similarly, the $p^+$-type contact region 37 also is selectively provided on the p-type base region 36 and is electrically connected to the emitter electrode 41.

The gate electrode 33 opposes at least the p-type base region 36 with the gate insulating layer 34 interposed.

In the example shown in FIG. 6, two $n^+$-type emitter regions 38 are provided between the mutually-adjacent gate electrodes 33; and the $p^+$-type contact region 37 is provided between the two $n^+$-type emitter regions 38. Instead of this structure, the semiconductor device 300 may have a structure in which the $p^+$-type contact region 37 and the $n^+$-type emitter region 38 are provided alternately in the Y-direction between the mutually-adjacent gate electrodes 33.

In a general power conversion circuit, a bridge circuit is formed using multiple RC-IGBTs. When a voltage that is not less than the threshold is applied to the gate electrode 33 of one RC-IGBT, a channel (an inversion region) is formed in the region of the p-type base region 36 at the vicinity of the interface with the gate insulating layer 34. The IGBT is switched to the ON state by forming the channel in a state in which a voltage that is positive with respect to the emitter electrode 41 is applied to the collector electrode 40. At this time, electrons are injected into the n⁻-type semiconductor region 1 from the n⁺-type emitter region 38 via the channel; holes are injected into the n⁻-type semiconductor region 1 from the p⁺-type collector region 31; the RC-IGBT is switched to a conducting state; and a current flows in a load. Typically, the load is an inductance.

Subsequently, when the voltage of the gate electrode 33 becomes the threshold voltage or less, the channel of the p-type base region 36 vanishes; and the IGBT is switched to the OFF state.

When the IGBT is switched to the OFF state, the current that was flowing in the inductance load flows in the FRD region 310 from the emitter electrode 41 toward the collector electrode in another RC-IGBT connected in parallel with the inductance load. Then, when the RC-IGBT that was turned OFF is switched again to the ON state, a depletion layer spreads in the FRD region 310; and impact ionization may occur in the p-type semiconductor region 4.

In the embodiment, the semiconductor device 300 includes the p-type semiconductor region 4 and the insulating unit 10 in the FRD region 310. Therefore, even in the case where the impact ionization occurs in the FRD region 310, the current that flows in the p-type semiconductor region 4 can be reduced. As a result, it is possible to reduce the likelihood of breakdown of the semiconductor device.

Although the semiconductor device 300 shown in FIG. 6 has a so-called trench gate structure in which the gate electrode 33 is provided inside a trench made in the semiconductor layer S, the semiconductor device 300 may have a so-called planar gate structure in which the gate electrode 33 is provided on the front surface S1.

Fourth Embodiment

A semiconductor device 400 according to a fourth embodiment will now be described using FIG. 7.

Figure 7:
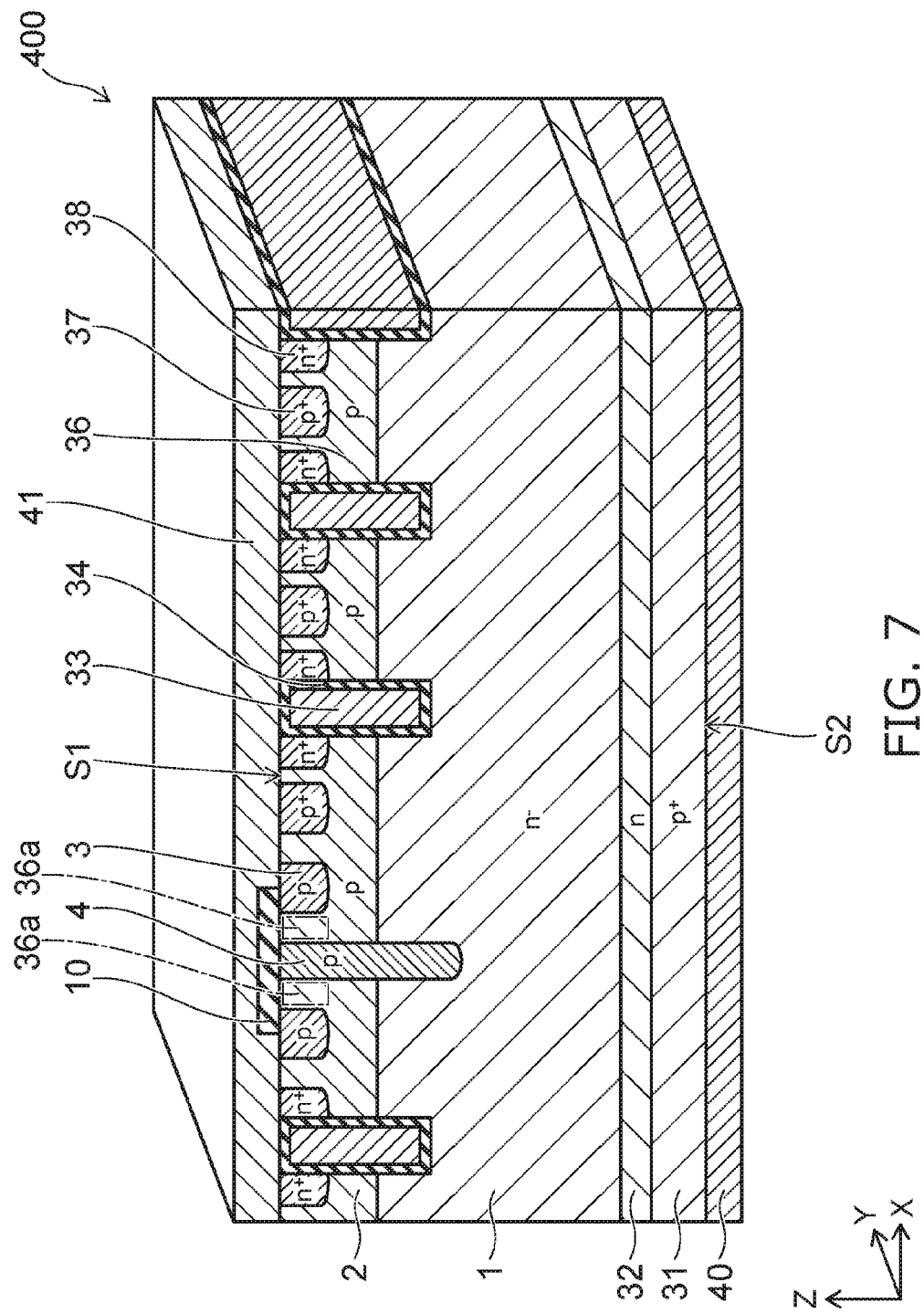
FIG. 7 is a cross-sectional view of the semiconductor device according to the fourth embodiment.

FIG. 7 is a cross-sectional view of the semiconductor device 400 according to the fourth embodiment.

The semiconductor device 400 is, for example, an IGBT.

The semiconductor device 400 differs from the semiconductor device 300 in that, for example, the n⁺-type semiconductor region 5 is not included; and the p-type semiconductor region 3 and the p-type semiconductor region 4 are provided inside the p-type base region 36.

In the semiconductor device 400, the p⁺-type collector region 31 is provided on the back surface S2 side of the semiconductor layer S. The n-type buffer region 32, the n⁻-type semiconductor region 1, and the p-type base region 36 are provided on the p⁺-type collector region 31.

At least a portion of the p-type semiconductor region 3 and at least a portion of the p-type semiconductor region 4 are provided inside the p-type base region 36. The p-type semiconductor region 3 and the p-type semiconductor region 4 are provided between the mutually-adjacent gate electrodes 33. For example, the p-type impurity concentration of the p-type semiconductor region 3 and the p-type impurity concentration of the p-type semiconductor region 4 are higher than the p-type impurity concentration of the p-type base region 36. The depth in the −Z direction of the p-type semiconductor region 4 is deeper than the depth in the −Z direction of the gate insulating layer 34.

The insulating unit 10 is provided on the p-type semiconductor region 4, on a portion 36a, and on a portion of the p-type semiconductor region 3. The portion 36a is the portion of the p-type base region 36 positioned between the p-type semiconductor region 3 and the p-type semiconductor region 4.

By the semiconductor device 400 including the p-type semiconductor region 4 and the insulating unit 10, the current that flows in the semiconductor device 400 due to the occurrence of the impact ionization when the reverse voltage is applied between the n⁻-type semiconductor region 1 and the p-type base region 36 can be suppressed. As a result, it is possible to reduce the likelihood of breakdown occurring in the semiconductor device.

Fifth Embodiment

A semiconductor device 500 according to a fifth embodiment will now be described using FIG. 8 to FIG. 10.

Figure 8:
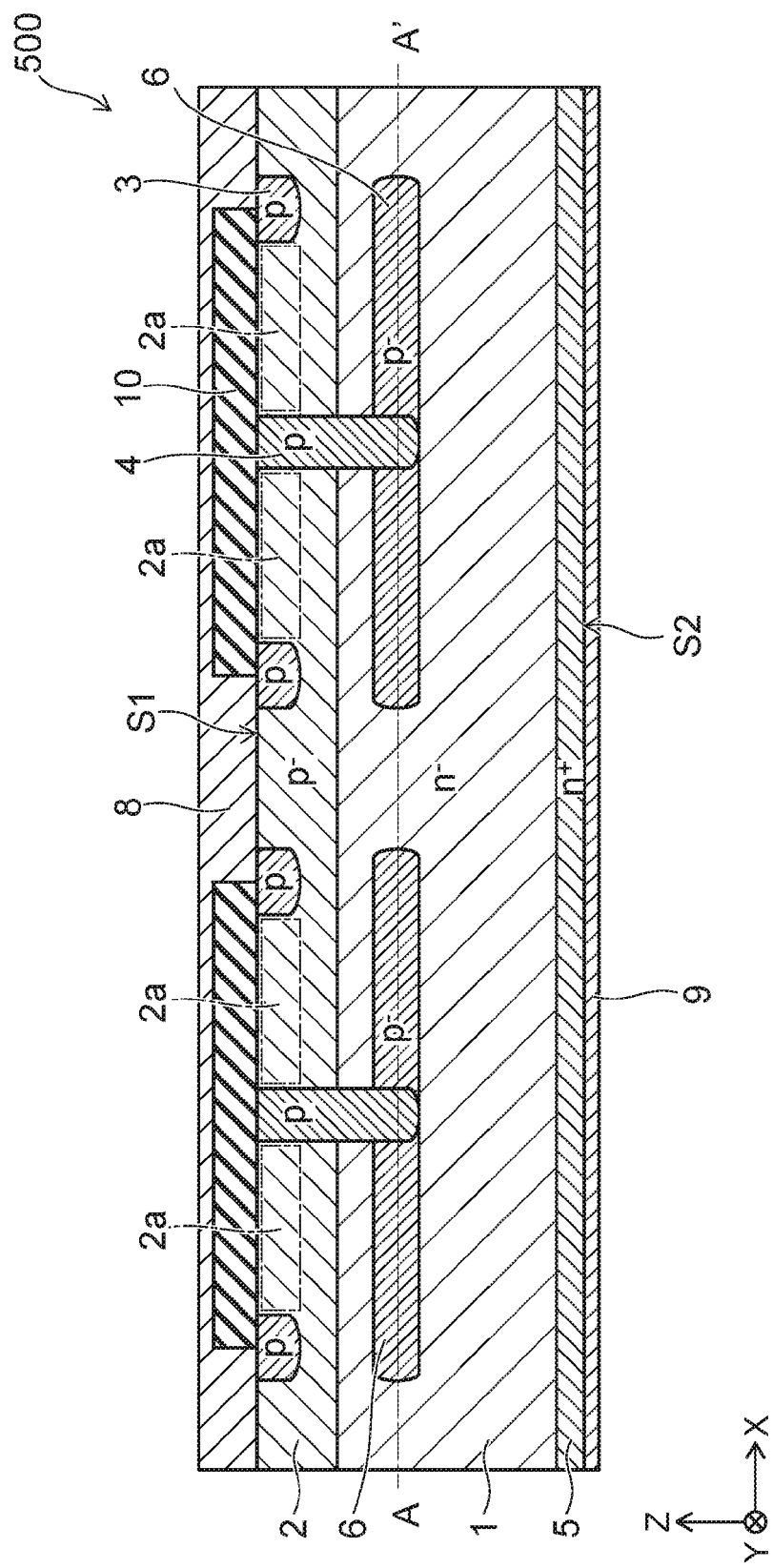
FIG. 8 is a cross-sectional view of the semiconductor device according to the fifth embodiment.

FIG. 8 is a cross-sectional view of the semiconductor device 500 according to the fifth embodiment.

Figure 9:
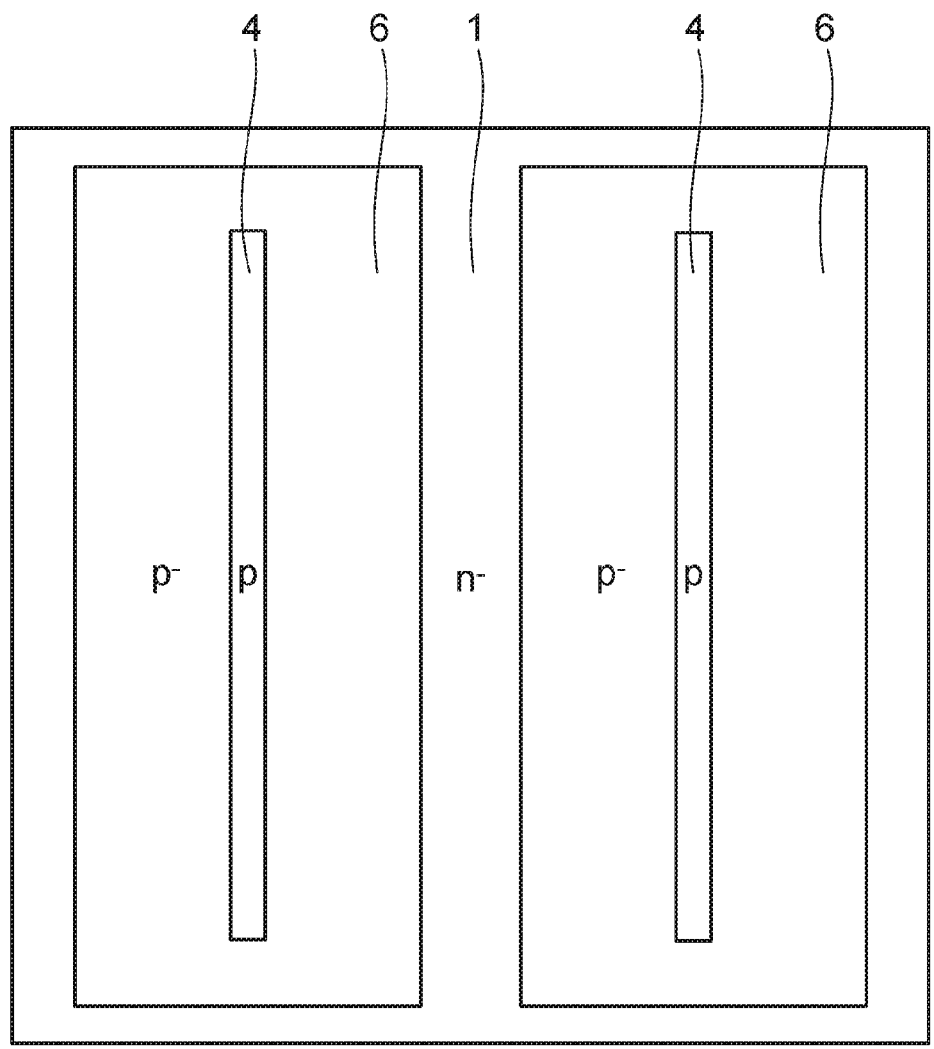
FIG. 9 is an example of a plan view including line A-A' of FIG. 8.

FIG. 9 is an example of a plan view including line A-A' of FIG. 8.

Figure 10:
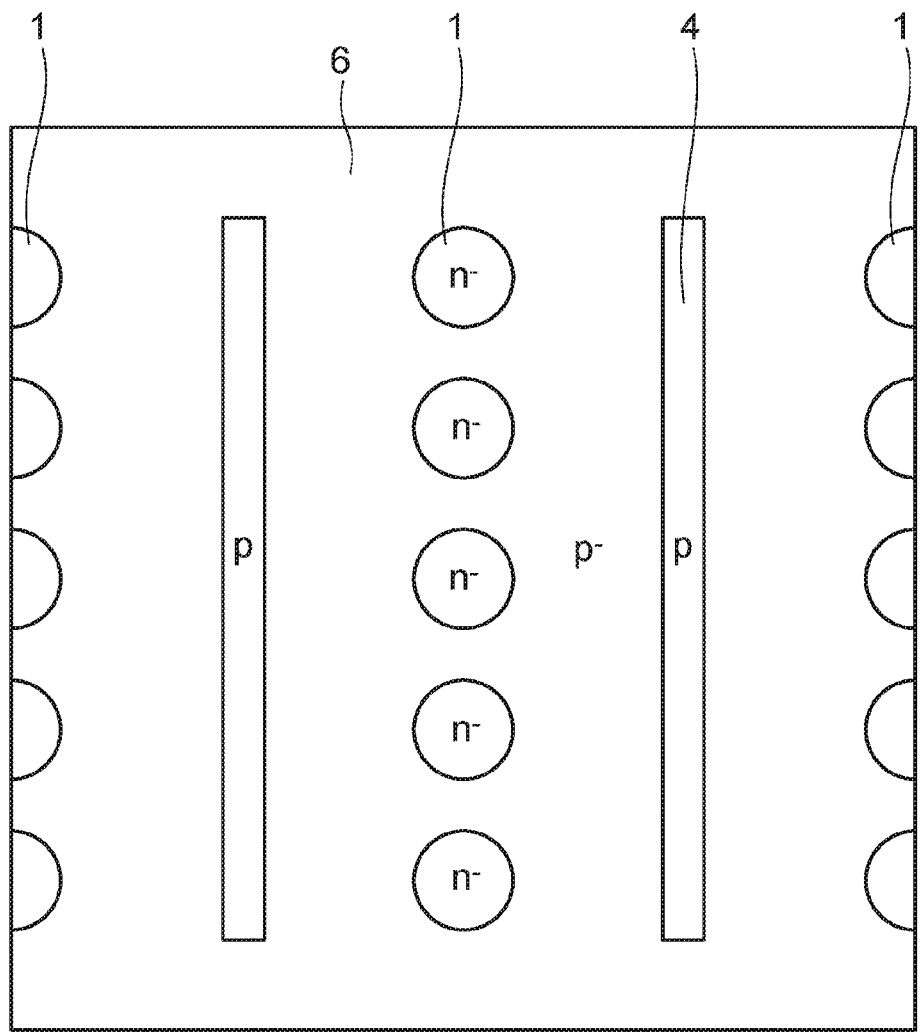
FIG. 10 is another example of a plan view including line A-A' of FIG. 8.

FIG. 10 is another example of a plan view including line A-A' of FIG. 8.

The semiconductor device 500 according to the embodiment differs from the semiconductor device 100 in that, for example, a p⁻-type semiconductor region 6 (a fifth semiconductor region) is further included.

The p⁻-type semiconductor region 6 is provided on the −Z direction side of the p⁻-type semiconductor region 2 and the p-type semiconductor region 3. In other words, the p⁻-type semiconductor region 6 is positioned lower than the p⁻-type semiconductor region 2 and the p-type semiconductor region 3. The p⁻-type semiconductor region 6 is surrounded with the n⁻-type semiconductor region 1. The p⁻-type semiconductor region 6 contacts the p-type semiconductor region 4. A portion of the p⁻-type semiconductor region 6 is positioned between the portion 2a and the n⁺-type semiconductor region 5 in the Z-direction.

In the example shown in FIG. 9, the multiple p⁻-type semiconductor regions 6 are provided to be separated from each other in the X-direction. Each of the p⁻-type semiconductor regions 6 is surrounded with the n⁻-type semiconductor region 1 along the X-Y plane.

In the example shown in FIG. 10, the p⁻-type semiconductor region 6 spreads along the X-Y plane and is connected to the multiple p-type semiconductor regions 4. A portion of the n⁻-type semiconductor region 1 is surrounded with the p⁻-type semiconductor region 6 along the X-Y plane.

In the examples of FIG. 9 and FIG. 10, the surface area of the p⁻-type semiconductor region 6 is greater than the surface area of the p-type semiconductor region 4 along the X-Y plane.

By providing the p⁻-type semiconductor region 6 that is surrounded with the n⁻-type semiconductor region 1, impact ionization occurs easily in the p⁻-type semiconductor region 6. When the impact ionization occurs in the p⁻-type semiconductor region 6, a current flows in the anode electrode 8 via the p-type semiconductor region 4 and the p⁻-type semiconductor region 2. At this time, by setting the surface area of the p⁻-type semiconductor region 6 to be larger than the p-type semiconductor region 4, the number of points where the impact ionization occurs can be higher compared to the other embodiments.

Therefore, according to the embodiment, it is possible to improve the breakdown energy of the semiconductor device even more compared to the first embodiment.

By providing the multiple p⁻-type semiconductor regions 6 to be separated from each other as shown in FIG. 9, the current due to the impact ionization occurring in each of the p⁻-type semiconductor regions 6 can be caused to flow in the anode electrode 8 via the p-type semiconductor regions 4. Therefore, the likelihood of a large current flowing locally in the p⁻-type semiconductor region 6 when the impact ionization occurs can be reduced.

Or, by providing the p⁻-type semiconductor region 6 that spreads along the X-Y plane as shown in FIG. 10, the number of points where the impact ionization occurs can be higher. Therefore, the current density when the current flows through the p⁻-type semiconductor region 6 can be reduced. Also, by causing the impact ionization to occur dispersedly at more locations, the heat that is generated by the impact ionization is dispersed; and it is possible to suppress the temperature increase of the semiconductor device.

Sixth Embodiment

A semiconductor device 600 according to a sixth embodiment will now be described using FIG. 11.

Figure 11:
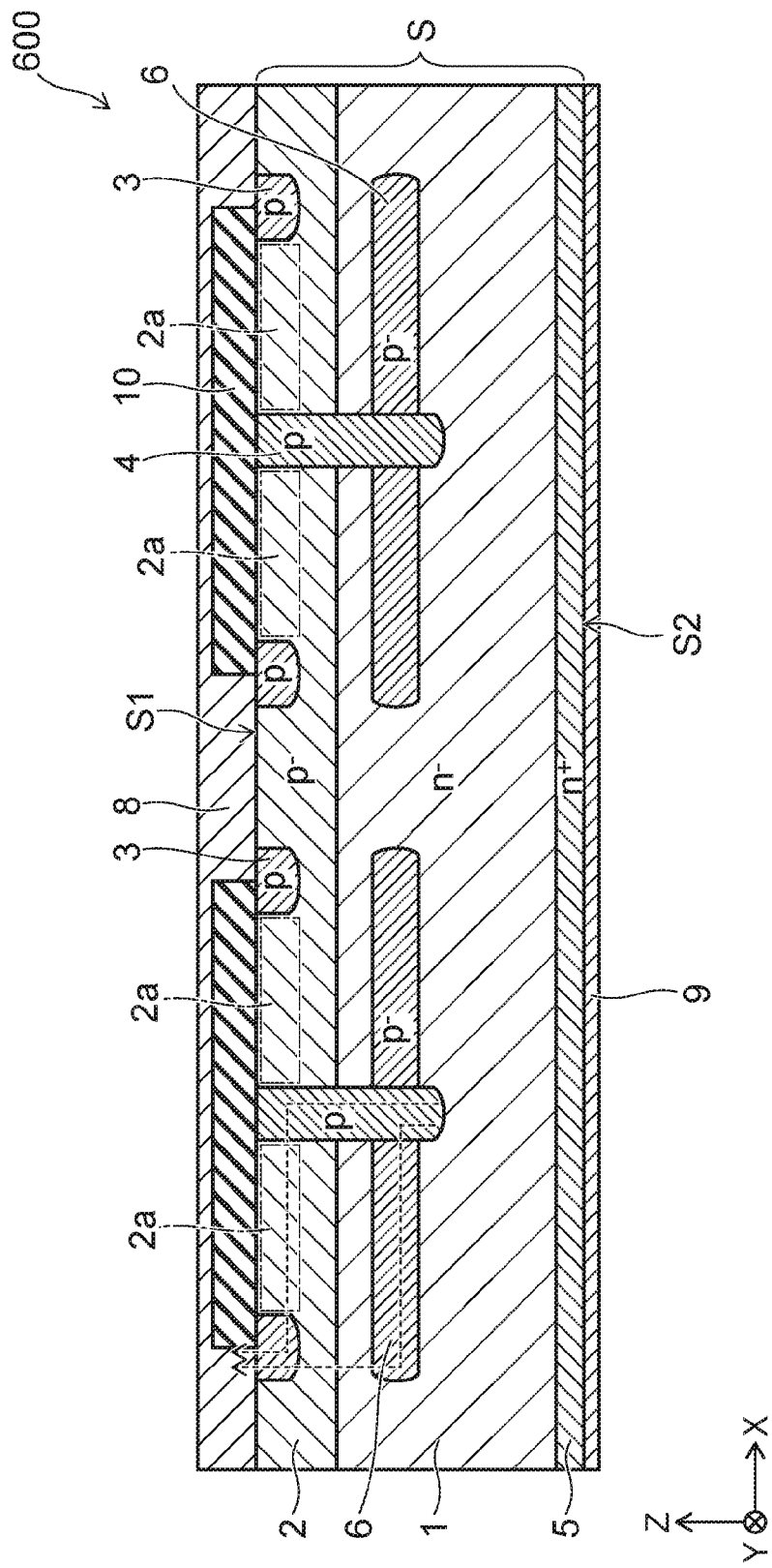
FIG. 11 is a cross-sectional view of the semiconductor device according to the sixth embodiment.

FIG. 11 is a cross-sectional view of the semiconductor device 600 according to the sixth embodiment.

In the semiconductor device 600 according to the embodiment, compared to the semiconductor device 500, for example, the end portion in the −Z direction of the p-type semiconductor region 4 is provided on the −Z direction side of the p⁻-type semiconductor region 6. The end portion of the p-type semiconductor region 4 is positioned lower than the p⁻-type semiconductor region 6. In other words, the distance in the Z-direction between the n⁺-type semiconductor region 5 and the p-type semiconductor region 4 is shorter than the distance in the Z-direction between the n⁺-type semiconductor region 5 and the p⁻-type semiconductor region 6.

By providing the end portion of the p-type semiconductor region 4 on the −Z direction side of the p⁻-type semiconductor region 6, the impact ionization occurs easily in the end portion of the p-type semiconductor region 4. At this time, the current due to the impact ionization flows mainly through the two paths illustrated by the broken lines in FIG. 11.

In other words, according to the embodiment, the current that is generated when the impact ionization occurs can be caused to flow dispersedly in multiple paths; and it is possible to reduce the current density. Therefore, according to the embodiment, compared to the first embodiment, it is possible to improve the breakdown energy of the semiconductor device even more.

It is possible to confirm the relative levels of the impurity concentrations of the semiconductor regions in the embodiments described above, for example, using a SCM (scanning capacitance microscope). The carrier concentrations of the semiconductor regions may be considered to be equal to the activated impurity concentrations of the semiconductor regions. Accordingly, the relative levels of the carrier concentrations of the semiconductor regions can be confirmed using SCM. It is possible to measure the impurity concentrations of the semiconductor regions, for example, using a SIMS (secondary ion mass spectrometer).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first semiconductor region of a first conductivity type;
a second semiconductor region of a second conductivity type provided on the first semiconductor region;
a third semiconductor region of the second conductivity type, at least a portion of the third semiconductor region being surrounded with the second semiconductor region;
a fourth semiconductor region of the second conductivity type, at least a portion of the fourth semiconductor region being surrounded with the second semiconductor region, the fourth semiconductor region being separated from the third semiconductor region, a carrier concentration of the second conductivity type of the fourth semiconductor region being higher than a carrier concentration of the second conductivity type of the second semiconductor region, the fourth semiconductor region protruding below more than the third semiconductor region; and
an insulating unit provided on a portion of the second semiconductor region positioned between the third semiconductor region and the fourth semiconductor region and on the fourth semiconductor region.

2. The device according to claim 1, wherein a carrier concentration of the second conductivity type of the third semiconductor region is higher than the carrier concentration of the second conductivity type of the second semiconductor region.

3. The device according to claim 1, wherein
the second semiconductor region includes:
a first portion; and
a second portion, a carrier concentration of the second conductivity type of the second portion being lower than a carrier concentration of the second conductivity type of the first portion,
the at least a portion of the third semiconductor region is surrounded with the first portion, and
the at least a portion of the fourth semiconductor region is surrounded with the second portion.

4. The device according to claim 1, further comprising a conductive unit provided on the insulating unit, on the second semiconductor region, and on the third semiconductor region.

5. The device according to claim 4, wherein
the second semiconductor region has a Schottky junction with the conductive unit, and
the third semiconductor region has an ohmic junction with the conductive unit.

6. The device according to claim 1, further comprising a fifth semiconductor region of the second conductivity type surrounded with the first semiconductor region, the fifth semiconductor region contacting the fourth semiconductor region.

7. The device according to claim 6, wherein a carrier concentration of the fourth semiconductor region is higher than a carrier concentration of the fifth semiconductor region, a lower end of the fourth semiconductor region is positioned lower than the fifth semiconductor region.

8. The device according to claim 1, wherein a carrier concentration of the second conductivity type of the fourth semiconductor region is higher than the carrier concentration of the second conductivity type of the third semiconductor region.

9. The semiconductor device according to claim 8, wherein
the third semiconductor region extends in a second direction orthogonal to the first direction that is from the second semiconductor region toward the first semiconductor region, and
a length in a third direction of the fourth semiconductor region is shorter than a length in the third direction of the third semiconductor region, the third direction being orthogonal to the first direction and the second direction.

10. The device according to claim 9, wherein a portion of the insulating unit is provided on the third semiconductor region.

11. The device according to claim 10, wherein
the third semiconductor region is multiply provided in the third direction,
the fourth semiconductor region is provided between the plurality of third semiconductor regions in the third direction, and
the portion of the insulating unit is provided on the third semiconductor region adjacent to the fourth semiconductor region in the third direction.

12. A semiconductor device, comprising:
a sixth semiconductor region of a first conductivity type;
a first semiconductor region of the first conductivity type provided on the sixth semiconductor region, a carrier concentration of the first conductivity type of the first semiconductor region being lower than a carrier concentration of the first conductivity type of the sixth semiconductor region;
a second semiconductor region of a second conductivity type provided on the first semiconductor region;
a third semiconductor region of the second conductivity type, at least a portion of the third semiconductor region being surrounded with the second semiconductor region;
a fourth semiconductor region of the second conductivity type, at least a portion of the fourth semiconductor region being surrounded with the second semiconductor region, the fourth semiconductor region being separated from the third semiconductor region, a carrier concentration of the second conductivity type of the fourth semiconductor region being higher than a carrier concentration of the second conductivity type of the second semiconductor region, a distance in a first direction between the fourth semiconductor region and the sixth semiconductor region being shorter than a distance in the first direction between the third semiconductor region and the sixth semiconductor region, the first direction being from the second semiconductor region toward the first semiconductor region; and
an insulating unit provided on the fourth semiconductor region and on a portion of the second semiconductor region positioned between the third semiconductor region and the fourth semiconductor region.

13. A semiconductor device, comprising:
a first semiconductor region of a first conductivity type;
a second semiconductor region of a second conductivity type provided on the first semiconductor region;
a third semiconductor region of the second conductivity type, at least a portion of the third semiconductor region being surrounded with the second semiconductor region;
a fourth semiconductor region of the second conductivity type, at least a portion of the fourth semiconductor region being surrounded with the second semiconductor region, the fourth semiconductor region being separated from the third semiconductor region, a carrier concentration of the second conductivity type of the fourth semiconductor region being higher than a carrier concentration of the second conductivity type of the second semiconductor region, an end portion in a first direction of the fourth semiconductor region being provided on the first-direction side of an end portion in the first direction of the third semiconductor region, the first direction being from the second semiconductor region toward the first semiconductor region; and
an insulating unit provided on a portion of the second semiconductor region positioned between the third semiconductor region and the fourth semiconductor region and on the fourth semiconductor region.

* * * * *